United States Patent
Lee

(10) Patent No.: US 11,379,356 B2
(45) Date of Patent: Jul. 5, 2022

(54) MEMORY SYSTEM FOR HANDLING PROGRAM FAILURE AND AN OPERATING METHOD THEREOF

(71) Applicant: SK hynix Inc., Gyeonggi-do (KR)

(72) Inventor: Joo Young Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 16/996,215

(22) Filed: Aug. 18, 2020

(65) Prior Publication Data

US 2021/0263844 A1     Aug. 26, 2021

(30) Foreign Application Priority Data

Feb. 26, 2020    (KR) ........................ 10-2020-0023602

(51) Int. Cl.
| | |
|---|---|
| *G06F 12/00* | (2006.01) |
| *G06F 12/02* | (2006.01) |
| *G06F 12/0895* | (2016.01) |
| *G06F 12/0891* | (2016.01) |
| *G06F 13/16* | (2006.01) |
| *G06F 11/10* | (2006.01) |
| *G06F 11/07* | (2006.01) |
| *G06F 11/30* | (2006.01) |
| *G06F 12/0882* | (2016.01) |

(52) U.S. Cl.
CPC ........ *G06F 12/0246* (2013.01); *G06F 11/076* (2013.01); *G06F 11/1068* (2013.01); *G06F 11/3037* (2013.01); *G06F 12/0882* (2013.01); *G06F 12/0891* (2013.01); *G06F 12/0895* (2013.01); *G06F 13/1673* (2013.01)

(58) Field of Classification Search
None
See application file for complete search history.

(56) References Cited

U.S. PATENT DOCUMENTS

2011/0145633 A1*   6/2011   Dickens ................ G06F 11/073
                                                  714/6.1

FOREIGN PATENT DOCUMENTS

| KR | 10-1337812 | 12/2013 |
|---|---|---|
| KR | 10-1903091 | 10/2018 |

* cited by examiner

*Primary Examiner* — Daniel D Tsui
(74) *Attorney, Agent, or Firm* — IP & T Group LLP

(57) ABSTRACT

A memory system includes a memory device and a controller. The memory device includes a memory block configured to store target data. The controller is configured to maintain the target data in a write buffer until a program operation to the memory block succeeds, update a write cache tag regarding the target data when the program operation fails and a read only mode is entered, and read the target data from the write buffer based on the write cache tag when a read command regarding the target data is received.

20 Claims, 12 Drawing Sheets

FIG. 8A

| INDEX i | INFO_LA | 802 |
|---|---|---|
| INDEX 1 | NULL | |
| INDEX 2 | LA2 | |
| ⋮ | ⋮ | |
| INDEX 9 | NULL | |
| INDEX 10 | NULL | |

FIG. 8B

| INDEX i | INFO_LA |
|---------|---------|
| INDEX 1 | NULL |
| INDEX 2 | NULL |
| ⋮ | ⋮ |
| INDEX 9 | NULL |
| INDEX 10 | NULL |

| INDEX i | INFO_LA |
|---|---|
| INDEX 1 | NULL |
| INDEX 2 | LA2 |
| ⋮ | ⋮ |
| INDEX 9 | NULL |
| INDEX 10 | NULL |

| INDEX i | INFO_LA |
|---|---|
| INDEX 1 | NULL |
| INDEX 2 | NULL |
| ⋮ | ⋮ |
| INDEX 9 | LA2 |
| INDEX 10 | NULL |

808

MEMORY SYSTEM FOR HANDLING PROGRAM FAILURE AND AN OPERATING METHOD THEREOF

CROSS-REFERENCE TO RELATED APPLICATION

This patent application claims priority to Korean Patent Application No. 10-2020-0023602, filed on Feb. 26, 2020, the entire disclosure of which is incorporated herein by reference.

TECHNICAL FIELD

One or more embodiments of this disclosure relate to a memory system and a method for operating a memory system for handling program failure.

BACKGROUND

The computer environment paradigm has moved to ubiquitous computing systems that can support computer system access anytime and anywhere. As a result, use of portable electronic devices (e.g., mobile phones, digital cameras, notebook computers) has rapidly increased. These portable electronic devices generally use a memory system having one or more memory devices for storing data. The memory system may serve as a main storage device or an auxiliary storage device.

Data storage devices that use non-volatile semiconductor memories demonstrate several advantages over hard disks. For example, data storage devices that use non-volatile semiconductor memories do not have mechanical driving parts (e.g., mechanical arms) and thus may exhibit improved performance in terms of stability and durability. These data storage devices may also achieve faster data access speeds and may consume comparatively less power. Examples of data storage devices that are able to achieve these performance improvements include, but are not limited to, Universal Serial Bus (USB)-type memory devices, memory cards having various interfaces, and solid state drives (SSDs).

SUMMARY

An embodiment of the disclosure provides a memory system, a data processing system, and an operation process or a method, which can quickly and reliably process data into a memory device by reducing operational complexity and performance degradation of the memory system thereby enhancing usage efficiency of the memory device.

An embodiment of the disclosure can provide a method and an apparatus for maintaining target data in a write buffer when program failure occurs in a read only mode. The target data is subject to a program operation in response to a request inputted from an external. The memory system may enter the read only mode when no available free block is in the memory device.

In an embodiment, a memory system can include a memory device including a memory block configured to store target data; and a controller configured to maintain the target data in a write buffer until a program operation to the memory block succeeds, update a write cache tag regarding the target data when the program operation fails and a read only mode is entered, and read the target data from the write buffer based on the write cache tag when a read command regarding the target data is received.

The write cache tag can include a physical address of the target data stored in the write buffer, a logical address regarding the target data and information indicating a validity of the logical address.

The controller can be configured to read the target data from the write buffer when a first logical address included in the write cache tag is valid and is same as a second logical address inputted along with the read command.

The controller can be configured to set a logical address regarding the target data in the write cache tag as invalid while the program operation is performed.

The controller can be configured to update the write cache tag by validating the logical address regarding the target data in the write cache tag.

The controller can be configured to establish that the memory block is a bad memory block when the program operation to the memory block is failed.

The controller can be configured to enter the read only mode when a count of memory blocks established as the bad memory block is equal to, or greater than, a threshold.

The controller can be configured to store the target data in the write buffer when the target data is provided from an external device, and to control the memory device to perform the program operation regarding the target data.

The controller can be configured to maintain the target data stored in the write buffer when entering the read only mode.

The controller can be configured to skip an error handling operation associated with the program operation when the program operation fails and when entering the read only mode. The error handling operation can include allocating a free block for a new open memory block and re-programming the target data to the new open memory block.

In another embodiment, a memory system can include a memory device including a memory block and a page buffer; and a controller configured to move target data, stored in a write buffer, to the page buffer when performing a program operation to the memory block, load the target data stored in the page buffer to the write buffer when entering a read only mode after the program operation fails, update a write cache tag regarding the target data loaded in the write buffer. The controller can be configured to obtain the target data from the write buffer based on the write cache tag when a read request is received for the target data.

The write cache tag can include a physical address of the target data stored in the write buffer, a logical address regarding the target data, and information indicative of a validity of the logical address.

The controller can be configured to read the target data from the write buffer when a first logical address included in the write cache tag is valid and is same as a second logical address inputted along with the read command.

The controller can be configured to set a logical address regarding the target data in the write cache tag as invalid while the program operation is performed.

The controller can be configured to change a physical address of the memory device regarding the target data with a location of the target data loaded in the write buffer to update the write cache tag.

The controller can be configured to update the write cache tag by validating the logical address regarding the target data in the write cache tag.

The controller can be configured to establish that the memory block is a bad memory block when the program operation to the memory block fails.

The controller can be configured to enter the read only mode when a count of memory blocks established as the bad memory block is equal to, or greater than, a threshold.

The controller can be configured to store the target data in the write buffer when the target data is provided from an external device, and to control the memory device to perform the program operation regarding the target data.

The controller can be configured to skip an error handling operation associated with the program operation when the program operation fails and when entering the read only mode. The error handling operation can include allocating a free block for a new open memory block and re-programming the target data to the new open memory block.

In another embodiment, a system can include an input coupled to receive a command; and a controller configured to determine a memory block as a bad block and to control storage of target data in a write buffer when a first condition and a second condition are satisfied. The first condition can include a determination that the memory block is a bad block based on failure of a program operation performed for the memory block, the program operation performed based on the command received through the input. The second condition can include operation in a read only mode. The target data can include data corresponding to the program operation.

BRIEF DESCRIPTION OF THE DRAWINGS

The description herein makes reference to the accompanying drawings wherein like reference numerals refer to like parts throughout the figures.

FIGS. 8A to 8D illustrate an embodiment of a procedure for updating the write cache tag.

Figure 1:
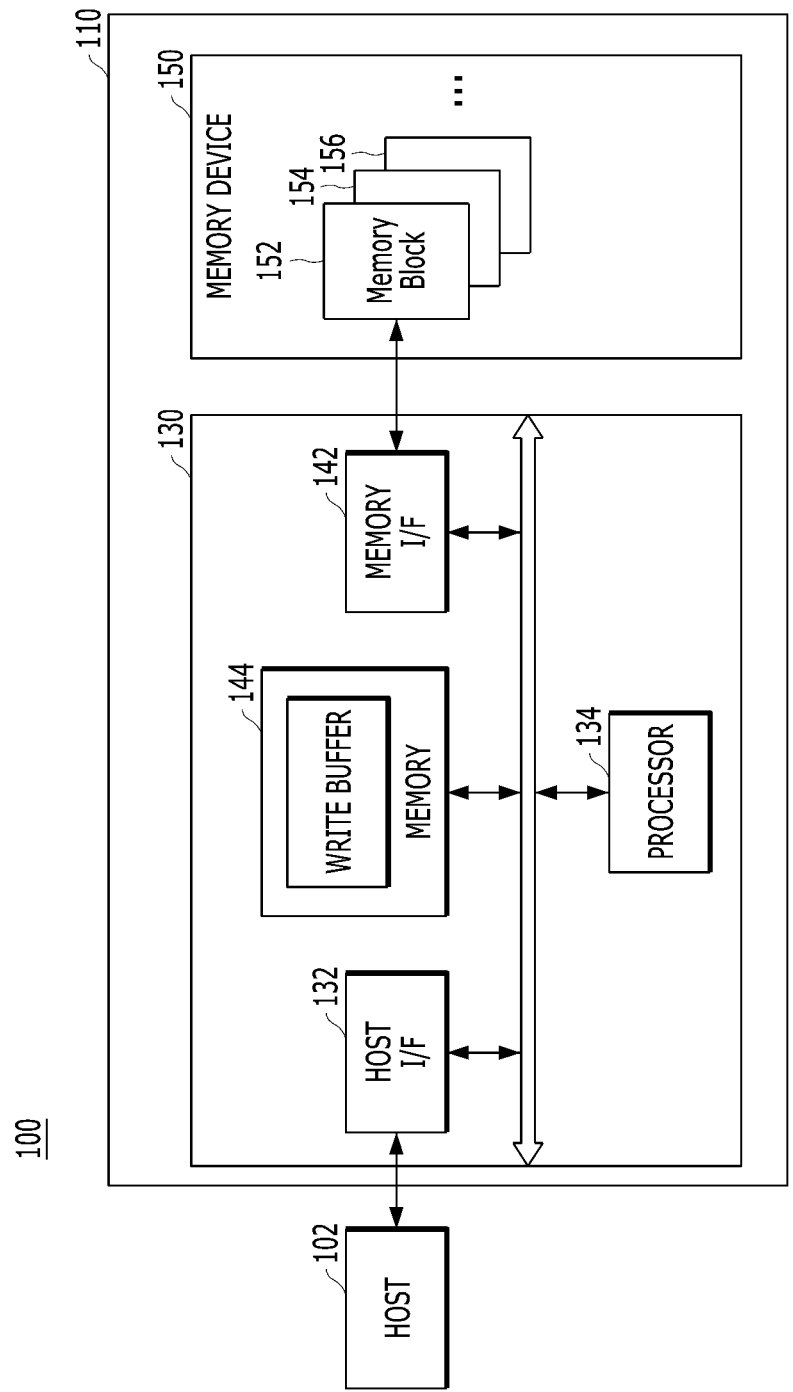
FIG. 1 illustrates a data processing system according to an embodiment.

This disclosure includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

DETAILED DESCRIPTION

Various embodiments of the disclosure are described below with reference to the accompanying drawings. Elements and features of the disclosure, however, may be configured or arranged differently to form other embodiments, which may be variations of any of the disclosed embodiments.

In this disclosure, the terms "comprise," "comprising," "include," and "including" are open-ended. As used in the appended claims, these terms specify the presence of the stated elements and do not preclude the presence or addition of one or more other elements. The terms in a claim does not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform a task even when the blocks/unit/circuit/component is not currently operational (e.g., is not on). The block/unit/circuit/component used with the "configured to" language include hardware, for example, a circuit, memory storing program instructions executable to implement the operation, etc. Reciting that a block/unit/circuit/component is "configured to" perform one or more tasks is expressly intended not to invoke 35 U.S.C. § 112, sixth paragraph, for an interpretation of the block/unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used in the disclosure, the term 'circuitry' refers to all of the following: (a) hardware-only circuit implementations (such as implementations in only analog and/or digital circuitry) and (b) combinations of circuits and software (and/or firmware), such as (as applicable): (i) a combination of processor(s) or (ii) portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" also covers an implementation of merely a processor (or multiple processors) or portion of a processor and its (or their) accompanying software and/or firmware. The term "circuitry" also covers, for example, and if applicable to a particular claim element, an integrated circuit for a storage device.

As used herein, these terms "first," "second," "third," and so on are used as labels for nouns that they precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects determination of A, such a phrase does not foreclose determination of A from also being based on C. In other instances, A may be determined based solely on B.

FIG. 1 illustrates a data processing system 100 according to an embodiment. Referring to FIG. 1, the data processing system 100 may include a host 102 engaged, interlocked, or otherwise in communication with a memory system 110. The host 102 may be operatively coupled with the memory system 110.

The host 102 may include, for example, a portable electronic device (e.g., a mobile phone, a MP3 player, a laptop computer, a tablet, etc.) or a non-portable electronic device (e.g., a desktop computer, a game player, a television, a projector, etc.).

The host 102 also includes at least one operating system (OS) that manages and controls functions and/or operations. The OS may provide interoperability between the host 102 operatively coupled with the memory system 110 and a user using the memory system 110. The OS may also support a function or an operation corresponding to user's request.

By the way of example but not limitation, the OS may be classified into a general operating system and a mobile operating system according to mobility of the host 102. The general operating system may further be classified into a personal operating system and an enterprise operating system according to a system requirement or user environment. An enterprise operating system can be specialized for securing and supporting higher performance computing than the personal operating system. Further, the OS may be specialized, like a mobile operating system, to support services or functions for mobility (e.g., a wireless telecommunication and a power saving function).

In an embodiment, the host 102 may include a plurality of operating systems. For example, the host 102 may execute multiple operating systems, each operating system interlocked with the memory system 110, in response to a user request. The host 102 may generate a plurality of commands corresponding to user's requests and transmit the plurality of commands to the memory system 110, in order to perform operations corresponding to commands within the memory system 110.

The memory system 110 may include a controller 130 and at least one memory device 150. The controller 130 may control the memory device 150 in response to a request or a command input from the host 102. For example, the controller 130 may perform a read operation to provide data read from the memory device 150 for the host 102 and/or perform a write operation (or a program operation) to store data input from the host 102 in the memory device 150. In order to perform data input/output (I/O) operations, the controller 130 may control and manage internal operations for data read, data program, data erase, or the like.

According to an embodiment, the controller 130 can include a host interface 132, a processor 134, a memory interface 142, and a memory 144. Components included in the controller 130 illustrated in FIG. 1 may be different according to an embodiment, for example, based on operational requirements or performance features of the memory system 110. For example, the memory system 110 may be implemented with one or more types of storage devices, and the controller 130 may include components configured to control the one or more types of storage devices. Further, the controller 130 may be electrically coupled with the host 102, according to a protocol of a host interface. Non-limiting examples of storage devices may include various types of solid state drives (SSDs), multimedia cards (MMCs), embedded MMCs (eMMCs), reduced size MMCs (RS-MMCs), micro-MMCs, secure digital (SD) cards, mini-SDs, micro-SDs, universal serial bus (USB) storage devices, universal flash storage (UFS) devices, compact flash (CF) cards, smart media (SM) cards, memory sticks, and the like. The components in the controller 130 may be added or omitted based at implementation of the memory system 110.

In one embodiment, the host 102 and the memory system 110 may include a controller or an interface for transmitting and receiving signals, data, and the like, in accordance with a set protocol. For example, the host interface 132 in the memory system 110 may include circuitry that transmit signals, data, and the like, to the host 102 and/or which receives signals, data, and the like, input from the host 102.

The host interface 132 may receive signals, commands (or requests), and/or data input from the host 102. For example, the host 102 and the memory system 110 may use a set protocol to transmit and receive data between each other. Examples of protocols or interfaces that may be supported by the host 102 and the memory system 110 for sending and receiving data include, but are not limited to, Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIE), Serial-attached SCSI (SAS), Serial Advanced Technology Attachment (SATA), Mobile Industry Processor Interface (MIPI), and the like. According to an embodiment, the host interface 132 may be a kind of layer configured to exchange data with the host 102 and, for example, may be implemented with, or driven by, firmware called a host interface layer (HIL).

Integrated Drive Electronics (IDE) or Advanced Technology Attachment (ATA) used as one of the interfaces for transmitting and receiving data may require a cable that has 40 wires that are connected in parallel to support data transmission and reception between the host 102 and the memory system 110.

When a plurality of memory systems (e.g., each constructed similarly to memory system 110) are connected to a single host 102, the plurality of memory systems may be divided into a master and a slave using, for example, a position or a dip switch to which the plurality of memory systems are connected. One of the memory systems may be set as the master, which is used as a main memory device. This may be supported, for example, by IDE (ATA) such as Fast-ATA, ATAPI, and Enhanced IDE (EIDE).

Serial Advanced Technology Attachment (SATA) is a kind of serial data communication interface that is compatible with various ATA standards of parallel data communication interfaces and may be used by Integrated Drive Electronics (IDE) devices. In an example, the 40 wires in the IDE interface may be reduced to six wires in the SATA interface, e.g., 40 parallel signals for the IDE can be converted into 6 serial signals for the SATA to be transmitted between each other. The SATA may be used because of its faster data transmission and reception rate and its smaller resource consumption in the host 102 used for data transmission and reception. SATA may support connection with up to 30 external devices to a single transceiver in the host 102. In addition, SATA can support hot plugging, that allows an external device to be attached or detached from the host 102 even while data communication between the host 102 and another device is being executed. Thus, the memory system 110 can be connected or disconnected as an additional device (like a device supported by a universal serial bus (USB)) even when the host 102 is powered on. For example, when the host 102 has an eSATA port, the memory system 110 may be freely detached like an external hard disk.

Small Computer System Interface (SCSI) is a kind of serial data communication interface used for connection between a computer, a server, and/or another peripheral device. SCSI can provide high transmission speeds compared with other interfaces, such as IDE and SATA. In SCSI, the host 102 and at least one peripheral device (e.g., the memory system 110) are connected in series, but data transmission and reception between the host 102 and each peripheral device may be performed through a parallel data communication. In SCSI, it easier to connect to, or disconnect from, the host 102 and/or a device such as the memory system 110. SCSI can support connections of 15 other devices to a single transceiver in host 102.

Serial Attached SCSI (SAS) can be understood as a serial data communication version of the SCSI. In SAS, not only the host 102 and a plurality of peripheral devices are connected in series, but also data transmission and reception between the host 102 and each peripheral device may be performed in a serial data communication scheme. SAS can support connection between the host 102 and the peripheral device through a serial cable instead of a parallel cable. Therefore, equipment using SAS can be easily managed and achieve enhanced or improved operational reliability and communication performance. In some cases, SAS may support connections of eight external devices to a single transceiver in the host 102.

Non-volatile memory express (NVMe) is a kind of interface based at least on Peripheral Component Interconnect Express (PCIe), which is designed to increase performance and design flexibility of the host 102, servers, computing devices, and the like, equipped with the non-volatile memory system 110. PCIe can use a slot or a specific cable for connecting the host 102 (e.g., a computing device) and the memory system 110 (e.g., a peripheral device). For example, PCIe can use a plurality of pins (for example, 18 pins, 32 pins, 49 pins, 82 pins, etc.) and at least one wire (e.g., ×1, ×4, ×8, ×16, etc.) to achieve high speed data communication over several hundred MB per second (e.g., 250 MB/s, 500 MB/s, 984.6250 MB/s, 1969 MB/s, etc.). According to an embodiment, the PCIe scheme may achieve bandwidths of tens to hundreds of Giga bits per second. A system using NVMe can make the most of the operation speed of the non-volatile memory system 110 (e.g., SSD), which operates at a higher speed than a hard disk.

According to an embodiment, the host 102 and the memory system 110 may be connected through a universal serial bus (USB). The Universal Serial Bus (USB) is a kind of scalable, hot-pluggable plug-and-play serial interface that can provide cost-effective standard connectivity between the host 102 and a peripheral device, e.g., a keyboard, a mouse, a joystick, a printer, a scanner, a storage device, a modem, a video camera, and the like. A plurality of peripheral devices (such as the memory system 110) may be coupled to a single transceiver in the host 102.

The memory interface 142 may serve as an interface for handling a command and a piece of data transferred between the controller 130 and the memory device 150, for example, in order to allow the controller 130 to control the memory device 150 in response to a command or a request input from the host 102. The memory interface 142 may generate a control signal for the memory device 150 and may process data input to, or output from, the memory device 150 under the control of the processor 134 when the memory device 150 is a flash memory. For example, when the memory device 150 includes a NAND flash memory, the memory interface 142 includes a NAND flash controller (NFC). The memory interface 142 can provide an interface for handling commands and data between the controller 130 and the memory device 150. In accordance with an embodiment, the memory interface 142 can be implemented through, or driven by, firmware called a Flash Interface Layer (FIL) as a component for exchanging data with the memory device 150.

According to an embodiment, the memory interface 142 may support an open NAND flash interface (ONFi), a toggle mode or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), and a toggle double data rate (DDR).

In an embodiment, the memory 144 may serve as a working memory in the memory system 110 or the controller 130, while storing temporary or transactional data that occurs or is delivered for operations in the memory system 110 and the controller 130. For example, the memory 144 may temporarily store read data output from the memory device 150 in response to a request from the host 102, before read data is output to the host 102. In addition, the controller 130 may temporarily store write data input from the host 102 in the memory 144 before programming the write data in memory device 150.

When the controller 130 controls operations (e.g., data read, data write, data program, data erase, etc.) of the memory device 150, data transmitted or generated between the controller 130 and the memory device 150 of the memory system 110 may be stored in the memory 144. In addition to the read data or write data, the memory 144 may store information (e.g., map data, read requests, program requests, etc.) used for inputting or outputting data between the host 102 and the memory device 150. According to an embodiment, the memory 144 may include a command queue, a program memory, a data memory, a write buffer/cache, a read buffer/cache, a data buffer/cache, a map buffer/cache, and/or the like. The controller 130 may allocate some storage space in the memory 144 for a component which is established to carry out a data input/output operation. For example, the write buffer established in the memory 144 may be used to temporarily store target data subject to a program operation.

In an embodiment, the memory 144 may be implemented with a volatile memory. For example, the memory 144 may be implemented with a static random access memory (SRAM), a dynamic random access memory (DRAM), or both. Although FIG. 1 illustrates, for example, the memory 144 disposed within the controller 130, the embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control overall operations of the memory system 110. For example, the processor 134 can control a program operation or a read operation of the memory device 150, in response to a write request or a read request from the host 102. According to an embodiment, the processor 134 may execute firmware (or other instructions/program codes) to control program operations or read operations in the memory system 110. In an embodiment, the firmware (or instructions/program codes) executed through the processor 134 may constitute a flash translation layer (FTL). According to an embodiment, the processor 134 may be implemented with a microprocessor or a central processing unit (CPU).

According to an embodiment, the memory system 110 may be implemented with at least one multi-core processor. The multi-core processor is a kind of circuit or chip in which two or more cores, which are considered distinct processing regions, are integrated. For example, when a plurality of cores in the multi-core processor drive or execute a plurality of flash translation layers (FTLs) independently, data input/output speed (or performance) of the memory system 110 may be improved. According to an embodiment, data input/output (I/O) operations in the memory system 110 may be independently performed through different cores in the multi-core processor.

The processor 134 in the controller 130 may perform an operation corresponding to a request or a command inputted from the host 102. Further, the memory system 110 may be independent of a command or a request inputted from an external device such as the host 102. Typically, an operation performed by the controller 130 in response to the request or the command inputted from the host 102 may be considered a foreground operation, while an operation performed by the controller 130 independently (e.g., regardless the request or the command inputted from the host 102) may be considered a background operation. The controller 130 can perform the foreground or background operation for read, write or program, erase and the like regarding a piece of data in the memory device 150.

In addition, a parameter set operation corresponding to a set parameter command or a set feature command (as a set command transmitted from the host 102) may be considered a foreground operation. Meanwhile, as a background operation without a command transmitted from the host 102, the controller 130 can perform garbage collection (GC), wear leveling (WL), bad block management for identifying and processing bad blocks, or the like may be performed, in relation to a plurality of memory blocks 152, 154, 156 included in the memory device 150.

According to an embodiment, substantially similar operations may be performed in the memory system 110 for both a foreground operation and a background operation. For example, when the memory system 110 performs garbage collection in response to a request or command from the host 102 (e.g., Manual GC), garbage collection can be considered a foreground operation. However, when the memory system 110 performs garbage collection independently of the host 102 (e.g., Auto GC), garbage collection can be considered a background operation.

When the memory device 150 includes a plurality of dies (or a plurality of chips) including non-volatile memory cells, the controller 130 may be configured to perform a parallel processing regarding plural requests or commands from the host 102, in order to improve performance of the memory system 110. For example, transmitted requests or commands may be divided and processed simultaneously into a plurality of dies or a plurality of chips in the memory device 150. The memory interface 142 in the controller 130 may be connected to a plurality of dies or chips in the memory device 150 through at least one channel and at least one way.

When the controller 130 distributes and stores data in a plurality of dies through one or more individual channels or ways, in response to requests or commands associated with a plurality of pages including non-volatile memory cells, plural operations corresponding to the requests or the commands can be performed simultaneously or in parallel. Such a processing method or scheme can be considered as an interleaving method. Because data input/output speed of the memory system 110 operating with the interleaving method may be faster than that without the interleaving method, data I/O performance of the memory system 110 can be improved.

By the way of example but not limitation, the controller 130 can recognize statuses regarding a plurality of channels (or ways) associated with a plurality of memory dies included in the memory device 150. The controller 130 may determine the status of each channel or each way, for example, as one of a busy status, a ready status, an active status, an idle status, a normal status, and/or an abnormal status. The determination by the controller 130 of which channel or way an instruction (and/or a data) is delivered through can be associated with a physical block address, e.g., which die(s) the instruction (and/or the data) is delivered into. In an embodiment, the controller 130 can refer to descriptors delivered from the memory device 150. The descriptors can include, for example, a block or page of parameters that describe something about the memory device 150, which may correspond to data which has a predetermined format or structure. Herein, the predetermined format or structure may be determined based on a protocol or settled specification between components. For instance, the descriptors may include device descriptors, configuration descriptors, unit descriptors, and the like. The controller 130 can refer to, or use, the descriptors to determine through which channel(s) or way(s) an instruction or a piece of data is exchanged.

Referring to FIG. 1, the memory device 150 in the memory system 110 may include the plurality of memory blocks 152, 154, 156. Each of the plurality of memory blocks 152, 154, 156 includes a plurality of non-volatile memory cells. According to an embodiment, the memory block 152, 154, 156 can be a group of non-volatile memory cells erased together. The memory block 152, 154, 156 may include a plurality of pages which is a group of non-volatile memory cells read or programmed together. In one embodiment, each memory block 152, 154, 156 may have a three-dimensional stack structure for a high integration. Further, the memory device 150 may include a plurality of dies, with each die including a plurality of planes and with each plane including the plurality of memory blocks 152, 154, 156. Configuration of the memory device 150 can be different in other embodiments, in order to satisfy requirements or achieve performance of the memory system 110 in various intended applications.

In the memory device 150 shown in FIG. 1, the plurality of memory blocks 152, 154, 156 are included. The plurality of memory blocks 152, 154, 156 can be different types of memory blocks, such as but not limited to single-level cell (SLC) memory blocks, multi-level cell (MLC) Cell) memory blocks, or the like, according, for example, to the number of bits that can be stored or represented in one memory cell. The SLC memory block includes a plurality of pages implemented by memory cells, each storing one bit of data. The SLC memory block can have high data I/O operation performance and high durability.

An MLC memory block includes a plurality of pages implemented by memory cells, each storing multi-bit data (e.g., two bits or more). The MLC memory block can have larger storage capacity for the same space compared to the SLC memory block. The MLC memory block can be highly integrated in a view of storage capacity.

In an embodiment, the memory device 150 may be implemented with MLC memory blocks such as a double level cell (DLC) memory blocks, triple-level cell (TLC)

memory blocks, quadruple-level cell (QLC) memory blocks or a combination thereof. Double-level cell (DLC) memory blocks may include a plurality of pages implemented by memory cells, each capable of storing 2-bit data. Triple-level cell (TLC) memory blocks can include a plurality of pages implemented by memory cells, each capable of storing 3-bit data. Quadruple-level cell (QLC) memory blocks can include a plurality of pages implemented by memory cells, each capable of storing 4-bit data. In another embodiment, the memory device 150 can be implemented with a block including a plurality of pages implemented by memory cells, each capable of storing five or more bits of data.

According to an embodiment, the controller 130 may use some of multi-level cell (MLC) memory blocks included in the memory device 150 as an SLC memory block that stores one-bit data in one memory cell. In one embodiment, a data input/output speed of the multi-level cell (MLC) memory block can be slower than that of the SLC memory block. For example, when some of the MLC memory blocks is used as the SLC memory block, the margin for a read or program operation can be reduced. The controller 130 can utilize a faster data input/output speed of the multi-level cell (MLC) memory block when using the multi-level cell (MLC) memory block as the SLC memory block. For example, the controller 130 can allocate the MLC memory block, which is used as the SLC memory block, for a buffer to temporarily store data, because the MLC memory block may support a high data input/output speed for improving performance of memory system 110.

Further, according to an embodiment, the controller 130 may program data in a multi-level cell (MLC) a plurality of times without performing an erase operation on a specific MLC memory block included in the memory device 150. Non-volatile memory cells may have a feature that does not support data overwrite. In one embodiment, the controller 130 may use a feature in which a multi-level cell (MLC) may store multi-bit data, in order to program plural pieces of 1-bit data in the MLC a plurality of times. For MLC overwrite operation, the controller 130 may store the number of program times as separate operation information when a piece of 1-bit data is programmed in a non-volatile memory cell. According to an embodiment, an operation for uniformly levelling threshold voltages of non-volatile memory cells can be carried out before data is overwritten in the same non-volatile memory cells.

In an embodiment of the disclosure, the memory device 150 is embodied as a non-volatile memory such as a flash memory, and, for example, such as a NAND flash memory, a NOR flash memory, and the like. In one embodiment, the memory device 150 may be implemented by at least one of a phase change random access memory (PCRAM), a ferroelectrics random access memory (FRAM), a spin injection magnetic memory (SU-RAM), and a spin transfer torque magnetic random access memory (STT-MRAM), or the like.

Figure 2:
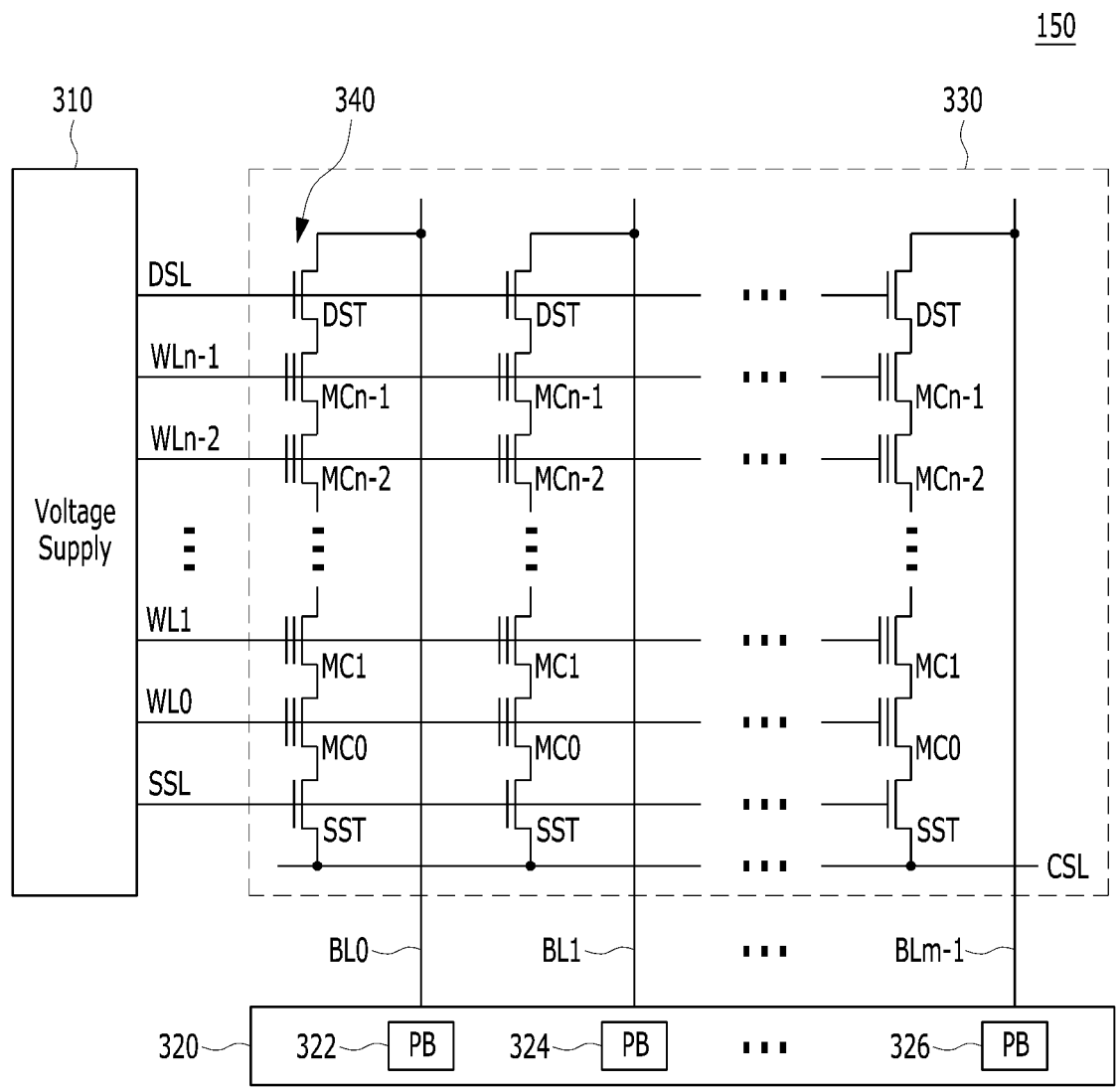
FIG. 2 illustrates an embodiment of a memory device in a memory system.

FIG. 2 illustrates an embodiment of memory device 150 in a memory system. Referring to FIG. 2, the memory device 150 may include a memory block 330. The memory block 330 is an example of each of the plurality of memory blocks 152 to 156 shown in FIG. 1. The memory block 330 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST, SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 2, the first cell string is coupled to the first bit line BL0, and the last cell string is coupled to the last bit line BLm−1.

Although FIG. 2 illustrates NAND flash memory cells, the memory cells may be of a different type in other embodiments. For example, the memory cells may be NOR flash memory cells, or hybrid flash memory cells including two or more types of memory cells combined therein. Also, the memory device 150 may be a flash memory device including a conductive floating gate as a charge storage layer or a charge trap flash (CTF) memory device including an insulation layer as a charge storage layer.

The memory device 150 may further include a voltage supply circuitry 310 which supplies word line voltages (e.g., a program voltage, a read voltage, and a pass voltage) to the word lines according to an operation mode or based on which memory cells are read, programmed or erased. The voltage generation operation of the voltage supply circuitry 310 may be controlled by control circuitry included in a chip containing memory device 150. Under the control of the control circuitry, the voltage supply circuitry 310 may select one of the memory blocks (or sectors) of the memory cell array, may select one of the word lines of the selected memory block, and may provide the word line voltages to selected word line and unselected word lines.

The memory device 150 may include a read/write circuitry 320 which is controlled by the control logic. During a verification/normal read operation, the read/write circuitry 320 may operate as a sense amplifier for reading data from the memory cell array. During a program operation, the read/write circuitry 320 may operate as a write driver for driving bit lines according to data to be stored in the memory cell array. During a program operation, the read/write circuitry 320 may receive from buffer data to be stored into the memory cell array, and may supply a current or a voltage onto bit lines according to the received data. The read/write circuitry 320 may include a plurality of page buffers 322 to 326 respectively corresponding to columns (or bit lines) or column pairs (or bit line pairs). Each of the page buffers 322 to 326 may include a plurality of latches.

Figure 3:
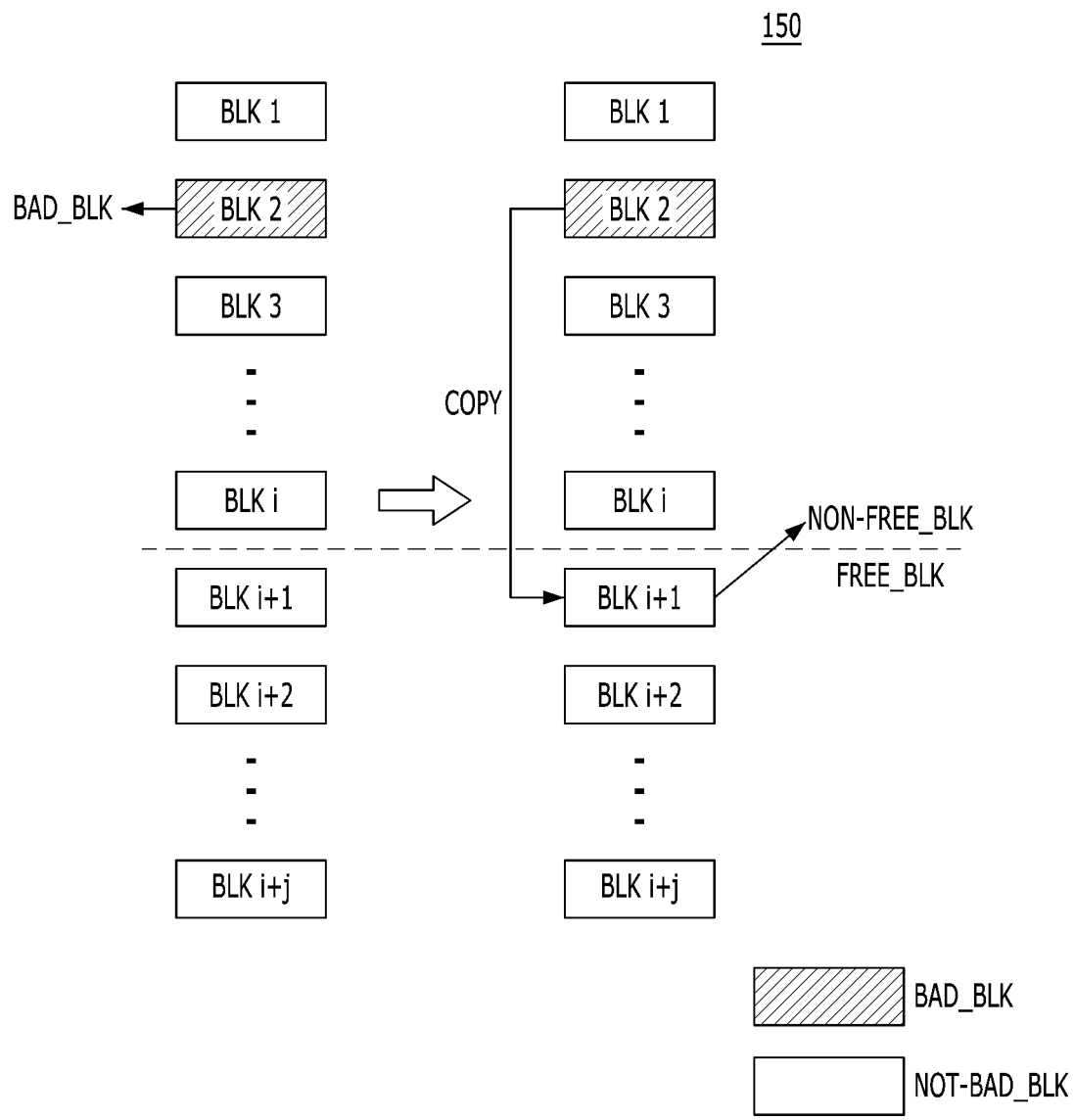
FIG. 3 illustrates an embodiment of a bad block replacement operation.

FIG. 3 illustrates an embodiment of an operation for performing bad block replacement. In FIG. 3, first to an ith blocks BLK1 to BLKi are non-free blocks and an (i+1) to an (i+j) memory blocks BLKi+1 to BLKi+j are free blocks (FREE_BLK), where i and j are positive integers.

When a second memory block BLK2 of the memory blocks BLK1 to BLKi which are considered the non-free blocks (NON-FREE_BLK) is found to be a bad block BAD_BLK, the controller 130 may replace the second memory block BLK2 with an i+1 memory block BLKi+1, which is one of the memory blocks BLKi+1 to BLKi+j considered the free blocks (FREE_BLK). For example, the controller 130 may copy all data stored in the second memory block BLK2 to the i+1 memory block BLKi+1 and perform a map update operation regarding copied data. After the second memory block BLK2 is replaced with the i+1 memory block BLKi+1, the controller 130 may access the i+1 memory block BLKi+1 instead of the second memory block BLK2 that was determined to be a bad block BAD_BLK.

After the memory system 110 is manufactured, a first storage capacity, which is an actual capacity of the memory system 110, may be different from a second storage capacity which is a capacity of the memory system 110 recognized by the host 102. The first capacity may be larger than the second capacity to prepare for a situation where a memory block is consumed due to a background operation, such as a bad block replacement operation described with reference to FIG. 3. For example, the memory system 110 may be manufactured such that the first capacity is a sum of the second capacity and an additional capacity. However, as the memory system 110 deteriorates, a run-time bad block may occur and also the number of unusable bad blocks may increase. As the number of bad blocks increases, the size of the additional capacity decreases. When the number of bad blocks reaches a threshold value, the size of the additional capacity may converge to a value of '0'. When the size of the additional capacity is reduced so that the first capacity is the same with the second capacity, the controller 130 may enter a read only mode.

According to an embodiment, when the number of memory blocks set as bad blocks (among the memory blocks included in the memory device 150) is greater than or equal to the threshold, the controller 130 can enter the read only mode. When entering the read only mode, the controller 130 can perform only a read operation based on a read command provided from the host 102, but does not perform a program operation based on a program command provided from the host 102.

Figure 4:
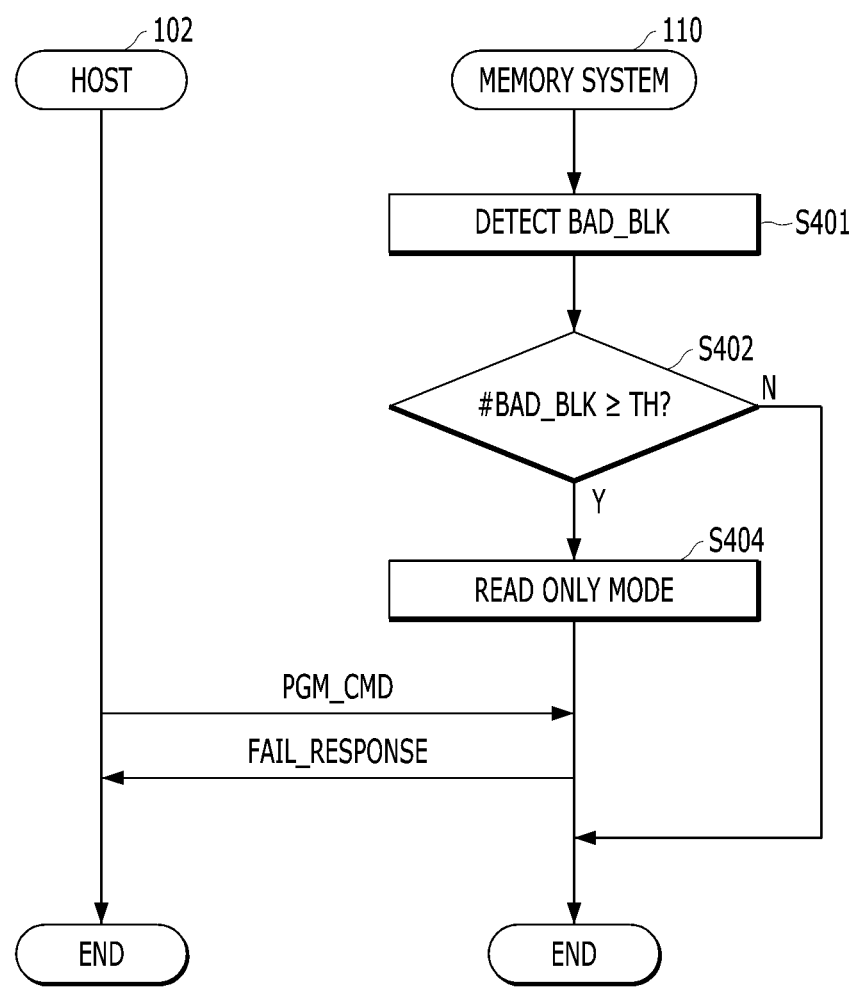
FIG. 4 illustrates an embodiment of a read only mode in a memory system.

FIG. 4 illustrates an embodiment for performing a read only mode in the memory system 110. In operation S401, the memory system 110 may determine which memory block is a bad block BAD_BLK. For example, the memory system 110 may determine that a memory block in which a program operation failed is a bad block BAD_BLK. Thereafter, the memory system 110 may update bad block information indicating the number of bad blocks included in the memory device 150. The memory system 110 may store the bad block information in the memory 144 or a memory block included in the memory device 150.

In operation S402, when the bad block BAD_BLK occurs, the memory system 110 may determine whether the number of bad blocks (#BAD_BLK) included in the memory device 150 is greater than or equal to the threshold TH. When the number of bad blocks (#BAD_BLK) in the memory device 150 is less than the threshold TH ('N' in operation S402), the memory system 110 does not enter the read only mode.

In operation S404, when the number of bad blocks (#BAD_BLK) included in the memory device 150 is greater than or equal to the threshold TH ('Y' in S402), the memory system 110 may enter the read only mode. The memory system 110 may output a fail signal FAIL_RESPONSE in response to a program command PGM_CMD input from the host 102 after entering the read only mode. After entering the read only mode, the memory system 110 does not perform a program operation corresponding to the program command PGM_CMD provided from the host 102 and, then, can send the fail signal FAIL_RESPONSE to the host 102.

Figure 5:
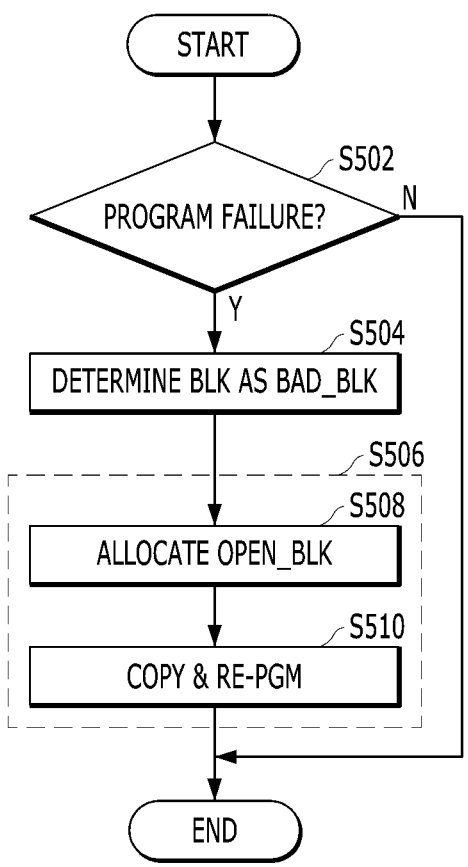
FIG. 5 illustrates an error-handling operation performed by a memory system for handling program failure.

FIG. 5 illustrates an embodiment of an error-handling operation performed by a memory system that has been proposed when program failure occurs.

In operation S502, when a program operation to the memory block fails, the memory device may provide a fail signal to the controller. The controller may determine whether to fail the program operation according to whether the fail signal is received. When the program operation does not fail, e.g., is successfully completed ('N' in S502), the controller may not perform following operations S504, S506.

In operation S504, when the program operation to the memory block fails ('Y' in S502), the controller may set the memory block as a bad block BAD_BLK.

Operation S506 may include operations S508 and S510. In operation S506, the controller may perform an error handling operation for curing failure of the program operation. The error handling operation may include a process for allocating or designating a free block as a new open block used for a program operation, copying valid data stored in a bad block to the allocated or designed open block, and re-programming data, associated with the failure of the program operation, in the allocated or designed open block.

In operation S508, the controller may allocate at least one free block included in the memory device as an open block OPEN_BLK. The open block OPEN_BLK may be considered a memory block in which data corresponding to a current or a new program operation can be programmed. In one embodiment, a free block may include a memory block in which all pages included in the memory block are empty, e.g., all pages are erased.

In operation S510, the controller may copy valid data stored in the memory block, determined as a bad block (BAD_BLK), to the open block OPEN_BLK allocated or designated in operation S508. Then, the controller may control the memory device to perform the program operation, which has been determined to fail in operation S502, to the allocated or designated open block OPEN_BLK.

In operation S504, after the memory block in which the program operation failed is determined as a bad block, the memory system may be stuck if the memory device has no free block to be allocated for an open block. Because there is no free block to be replaced with the memory block determined as the bad block, the memory system might perform operation S506 so that an error may not be cured. In the proposed memory system, an error handling operation may be performed regardless of the number of free blocks after program failure occurs. Thus, the error handling operation might not be performed in a situation where no free blocks exist in the memory device, and the memory system might become stuck.

According to an embodiment of the disclosure, when the program operation to a specific memory block fails, the controller 130 (e.g., see FIG. 1) may determine the specific memory block as a bad block. When the controller 130 determines a specific memory block as a bad block and enters a read only mode, an error handling operation for curing the failed program operation may be skipped and target data associated with the program operation (e.g., data subject to the program operation) may be stored in a write buffer.

Thereafter, when a read command is provided from the host 102, the controller 130 may determine whether a second logical address, input along with the read command, are identical with a first logical address associated with the target data stored in the write buffer. When the first and the second logical addresses are identical with each other, the controller 130 can read the target data from the write buffer, even though not accessing any memory cell in the memory device 150. Because the controller 130 skips the error-handling operation after entering the read-only mode, it is possible to avoid that the memory system 110 becomes stuck. Though the memory system 110 may be stuck based on whether a free block exists in the memory device 150, the controller 130 may reduce likelihood of occurrence that no free block exists in the memory device 150. Further, because the controller 130 stores the target data in a write buffer and provides the target data to the host 102 later, the integrity of the read data can be guaranteed and operation stability of the memory system 110 may be improved.

Figure 6A:
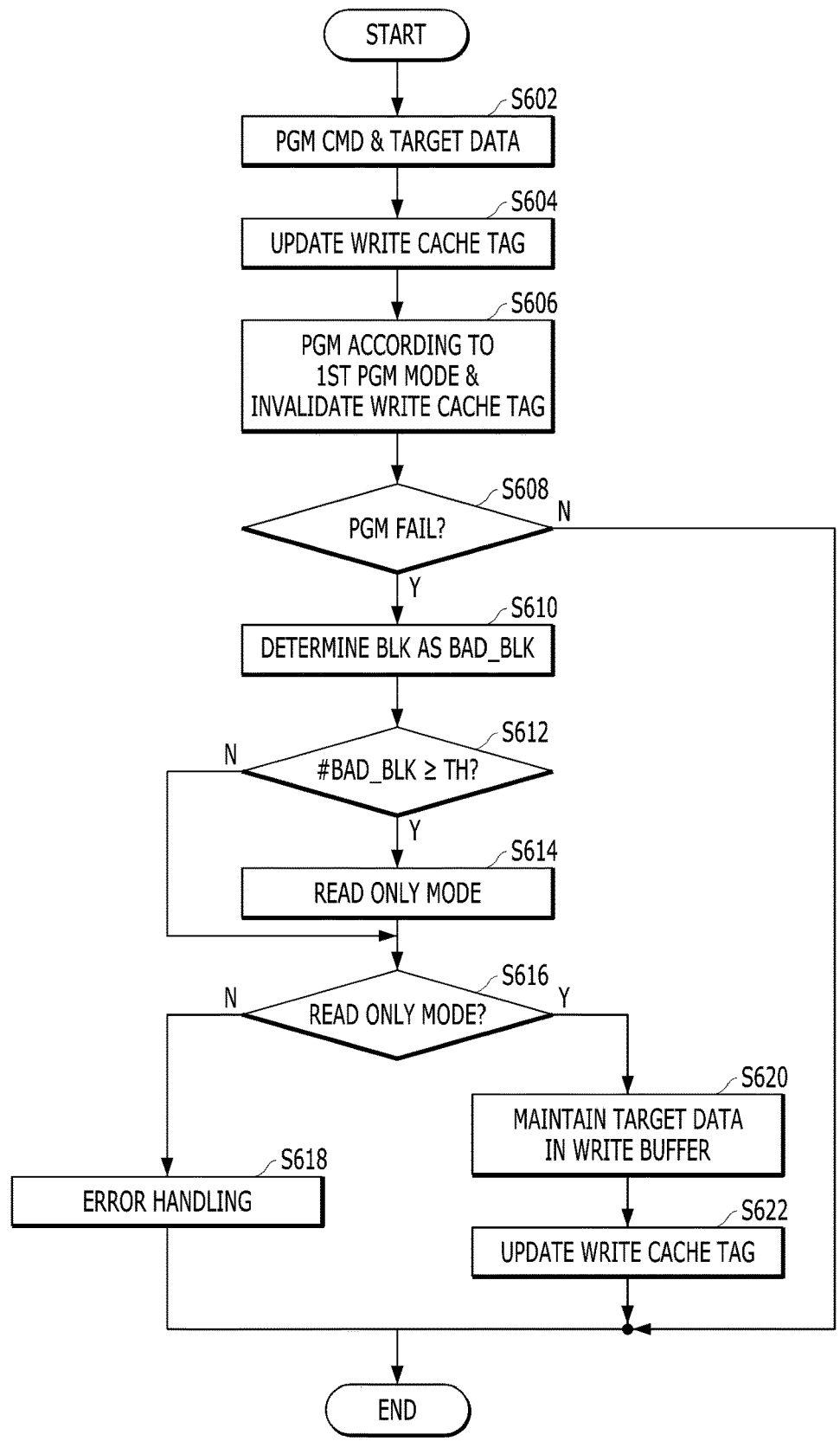
FIGS. 6A and 6B illustrate a method for operating a memory system according to an embodiment.
Figure 6B:
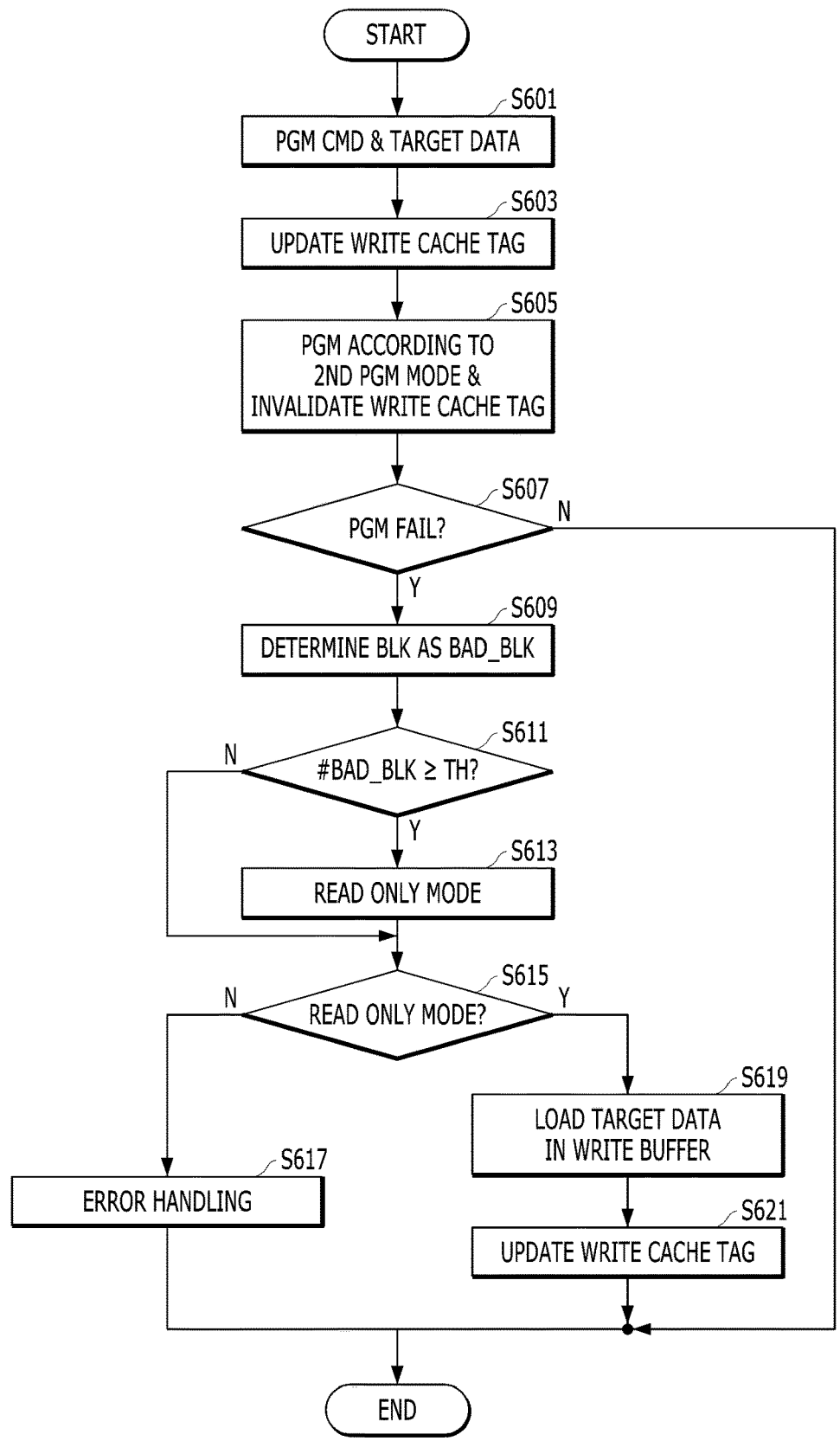

FIGS. 6A and 6B illustrate a method for operating a memory system according to embodiments of the disclosure.

FIG. 6A shows an embodiment for handling or processing data when a program operation with the data has failed in the memory system 110. For example, FIG. 6A describes a procedure associated with a read only mode of the memory system.

In operation S602, the controller 130 may receive a program command PGM_CMD with target data input from the host 102. The controller 130 may further receive information corresponding to a logical address associated with the target data. The controller 130 may temporarily store the target data in a write buffer (e.g., see FIG. 1).

In operation S604, the controller 130 may update a write cache tag regarding the target data stored in the write buffer. Referring to FIG. 8A, the controller 130 controls the write cache tag including plural indexes. For example, the controller 130 may add the logical address associated with the target data to an index, which corresponds to a location at which the target data is stored, among the plural indexes in the write cache tag. The write cache tag may be updated by the controller 130 writing the logical address associated with the target data in the index.

In operation S606, the controller 130 may control the memory device 150 and write buffer to program the target data in a memory block according to a first mode. For the program operation according to the first mode, the controller 130 may maintain the target data in the write buffer until the program operation is successfully completed in the memory device 150.

In addition, when a program operation with the target data is performed in the memory device 150, the controller 130 may invalidate the write cache tag associated with the target data. For example, in the write cache tag described in FIG. 8B, the controller 130 nullifies an area where a logical address associated with the target data is written in the write cache tag, e.g., write a value of NULL in the index so that information regarding the target data in the write cache tag can be invalidated.

In operation S608, the controller 130 may determine whether a program operation has failed in the memory block. For example, when the program operation has failed, the memory device 150 may provide a fail signal to the controller 130 and the controller 130 may recognize that the program operation has failed (e.g., has not been successfully completed) when the fail signal is received. When the program operation has not failed (e.g., has been successfully completed ('N' in S608), the controller 130 might not perform the following operations S610 to S622.

In operation S610, the controller 130 may determine a memory block where the program operation has failed in operation S608 as a bad block BAD_BLK. The controller 130 may not later perform a read operation, a program operation, or the like, to a memory block determined as a bad block BAD_BLK. Thereafter, the controller 130 may update information regarding bad blocks BAD_BLK, e.g., the number of bad blocks #BAD_BLK indicating how many bad blocks BAD_BLK are included in the memory device 150. The controller 130 may store information regarding the bad blocks BAD_BLK in at least one of the memory 144 or a memory block included in the memory device 150. In operation S612, when the bad block BAD_BLK occurs, the memory system 110 may determine whether the number of bad blocks #BAD_BLK included in the memory device 150 is greater than or equal to the threshold TH. When the number of bad blocks #BAD_BLK included in the memory device 150 is less than the threshold TH ('N' in S612), the controller 130 would not enter the read only mode.

In operation S614, when the number of bad blocks #BAD_BLK included in the memory device 150 is greater than or equal to the threshold TH ('Y' in S612), controller 130 may enter the read only mode.

In operation S616, the controller 130 may determine whether the read only mode has been entered. When the controller 130 has not entered the read only mode ('N' in S616), the controller 130 may perform operation S618 for performing an error handling operation, for example, as described in operation S506 in FIG. 5. In this case, the controller 130 may allocate a free block for an open block, copy valid data included in the bad block to the open block, and then control the memory device 150 to perform a reprogram operation with the target data to the open block.

In operation S620, the controller 130 may maintain, not release nor delete, the target data stored in the write buffer. For example, the controller 130 may check or determine a mode of the program operation that has failed in operation S608. The program mode PGM MODE may include first and second modes MODE1, MODE2. When the program operation is performed in the first mode MODE1, the controller 130 might not delete the target data stored in the write buffer until the program operation is successfully completed. But, when the program operation is performed in the second mode MODE2, the controller 130 may delete the target data in the write buffer after transmitting the target data stored in the write buffer to a page buffer of the memory device 150. Accordingly, whether the target data remains in the write buffer when the program operation has failed may be determined based on which mode of the first and second modes MODE1, MODE2 the program operation is performed with.

When the failed program operation has been performed with the first mode MODE1, the controller 130 may maintain the target data in the write buffer. When the program operation is performed with the first mode MODE1 as described above, the target data is maintained in the write buffer until the program operation is successfully completed. In this case, because the target data is kept in the write buffer, the controller 130 does not have to copy, load, or move the target data from other components to the write buffer for securing safety regarding the target data.

In operation S622, the controller 130 may update the write cache tag. Referring to FIGS. 8A to 8D, the write cache tag may include information regarding indexes and logical addresses corresponding to each of a plurality of areas included in the write buffer. The controller 130 may store the updated write cache tag stored in the memory 144 or in a memory block of the memory device 150.

In operation S620, the controller 130 may update the write cache tag after maintaining the target data in the write buffer. For example, referring to FIG. 8C, the controller 130 may use a value stored in in the write cache tag as a logical address associated with the target data later even when the program operation with the first mode has been failed in operation S608.

According to an embodiment, when the program operation with the first mode has failed in the memory system operating in the read only mode, the controller 130 can maintain the target data in the write buffer and update the write cache tag to include information regarding the target data stored in the write buffer. When a read command for the target data is input later from a host, the controller 130 can obtain the target data from the write buffer and provide the target data to the host. For example, whether the read command requests the target data may be determined based on a logical address input along with the read command. The controller 130 may determine whether the write cache tag includes the same address with the logical address input with the read command. When the same address is included in the write cache tag, the controller 130 can use an index associated with the same address to find a location at which the target data is stored in the write buffer. Herein, the index may be used as a physical address indicating an area in the write buffer.

FIG. 6B shows another embodiment for handling or processing data when a program operation with the data has failed in the memory system. Particularly, FIG. 6B describes a procedure associated with a read only mode of the memory system.

In operation S601, the controller 130 may receive a program command PGM_CMD with target data input from the host 102. The controller 130 may further receive information about a logical address associated with the target data. The controller 130 may temporarily store the target data in a write buffer (e.g., see FIG. 1).

In operation S603, the controller 130 may update a write cache tag regarding the target data stored in the write buffer. Referring to FIG. 8A, the controller 130 controls the write cache tag including plural indexes. For example, the controller 130 may add the logical address associated with the target data into an index, which corresponds to a location at which the target data is stored, among the plural indexes in the write cache tag. The write cache tag may be updated by the controller 130 writing the logical address associated with the target data in the index.

In operation S605, the controller 130 may control the memory device 150 and write buffer to program the target data in a memory block according to a second mode. For the program operation according to the second mode, the controller 130 may move the target data form the write buffer to a page buffer until the program operation is successfully completed in the memory device 150. Herein, the controller 130 may transfer the target data stored in the write buffer into the page buffer in the memory device 150, and then release or delete the target data stored in the write buffer.

In addition, when a program operation with the target data is performed in the memory device 150, the controller 130 may invalidate the write cache tag associated with the target data. For example, specific information associated with the target data in the write cache tag may be invalidated regardless of whether the program operation for the target data is performed with the first mode or the second mode. In one embodiment, in the write cache tag described in FIG. 8B, the controller 130 nullifies an area where a logical address associated with the target data is written in the write cache tag, e.g., write a value of NULL in the index so that information regarding the target data in the write cache tag can be invalidated.

In operation S607, the controller 130 may determine whether a program operation has failed in the memory block. For example, when the program operation has failed, the memory device 150 may provide a fail signal to the controller 130, and the controller 130 may recognize that the program operation is failed (e.g., not successfully completed) when the fail signal is received. When the program operation is not failed (e.g., successfully completed, which corresponds to 'N' in S607), controller 130 may not perform the following operations S619 to S621.

In operation S609, the controller 130 may determine a memory block where the program operation has failed in operation S607 as a bad block BAD_BLK. The controller 130 may not later perform a read operation, a program operation or the like, to a memory block determined as the bad block BAD_BLK. Thereafter, the controller 130 may update information regarding bad blocks BAD_BLK, e.g., the number of bad blocks #BAD_BLK indicating how many bad blocks BAD_BLK are included in the memory device 150. The controller 130 may store information regarding the bad blocks BAD_BLK in at least one of the memory 144 or a memory block included in the memory device 150.

In operation S611, when the bad block BAD_BLK occurs, the memory system 110 may determine whether the number of bad blocks #BAD_BLK included in the memory device 150 is greater than or equal to the threshold TH. When the number of bad blocks #BAD_BLK included in the memory device 150 is less than the threshold TH ('N' in S611), the controller 130 would not enter the read only mode.

In operation S613, when the number of bad blocks #BAD_BLK in the memory device 150 is greater than or equal to the threshold TH ('Y' in S612), controller 130 may enter the read only mode.

In operation S615, the controller 130 may determine whether the read only mode has been entered. When the controller 130 has not entered the read only mode ('N' in S615), the controller 130 may perform operation S617 of the error handling operation, which is described in operation S506 in FIG. 5. The controller 130 may allocate a free block for an open block, copy valid data included in the bad block to the open block, and then control the memory device 150 to perform a reprogram operation with the target data to the open block.

In operation S619, when the controller 130 enters the read only mode ('Y' in S615), the target data is loaded from the page buffer to the write buffer. For example, the controller 130 may determine a mode of the program operation failed in operation S607. The controller 130 may load the target data stored in the page buffer into the write buffer when the failed program operation is performed with the second mode MODE2. When the program operation is performed with the second mode MODE2 as described above, the controller 130 transmits the target data to the page buffer and delete or release the target data in the write buffer. Because the target data is not kept in the write buffer at the time when the program operation is failed, the controller 130 obtains the target data by loading the target data from the page buffer into the write buffer.

In operation S621, the controller 130 may update the write cache tag. The write cache tag, referring to FIGS. 8A to 8D, may include information regarding indexes and logical addresses corresponding to each of a plurality of areas included in the write buffer. The controller 130 may store the updated write cache tag stored in the memory 144 or in a memory block of the memory device 150.

In operation S619, the controller 130 may update the write cache tag after storing the target data in the write buffer. For example, referring to FIG. 8D, the controller 130 may load the target data from the page buffer when the program operation with the second mode has failed in operation S608 so that the target data can be stored in a blank area of the write buffer. For example, the blank area may be a fifth region. The controller 130 may write the logical address of the target data as information corresponding to a fifth index indicating the fifth region of the write buffer in which the target data is loaded and stored.

According to an embodiment, when the program operation with the second mode has failed in the memory system operating in the read only mode, the controller 130 can load the target data from the page buffer to the write buffer and update the write cache tag to include information regarding the target data stored in the write buffer. When a read command for the target data is input later from a host, the controller 130 can obtain the target data from the write buffer and provide the target data to the host. Whether the read command requests the target data may be determined based on a logical address input along with the read command. The controller 130 may determine whether the write cache tag includes the same address with the logical address input with the read command. When the same address is included in the write cache tag, the controller 130 can use an index associated with the same address to find a location at which the target data is stored in the write buffer. Herein, the index may be used as a physical address indicating an area in the write buffer.

Figure 7:
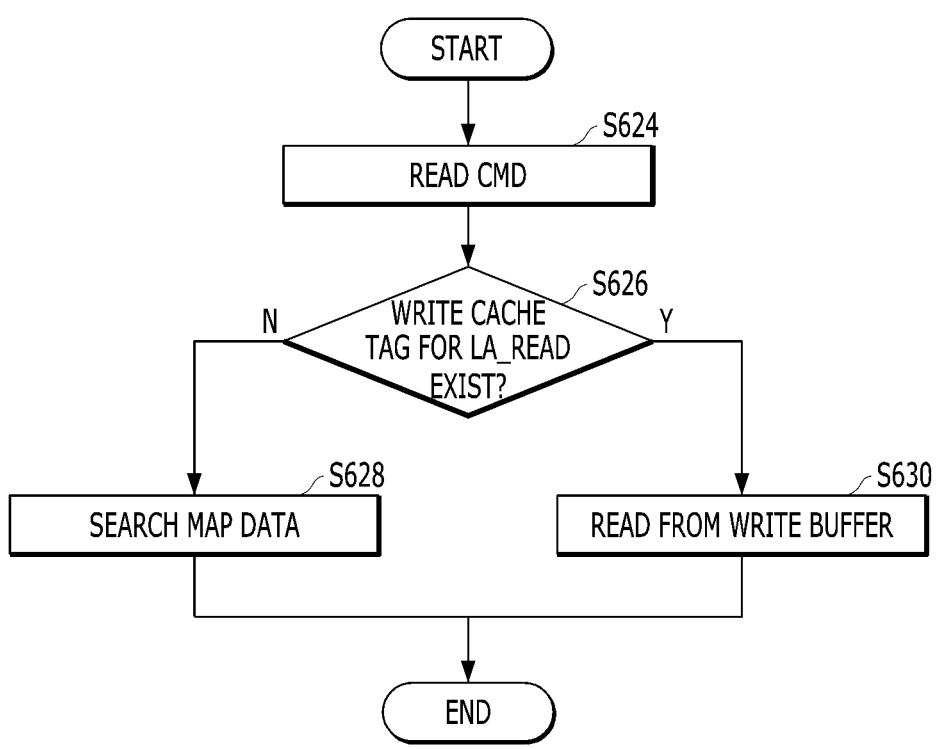
FIG. 7 illustrates an embodiment of a procedure for reading program-failed data from a write buffer based on a write cache tag to output read data to a host.

FIG. 7 illustrates an embodiment of a procedure for reading program-failed data from a write buffer based on a write cache tag to output read data to a host.

In operation S624, the controller 130 may receive a read command READ_CMD input from the host 102. The read command READ_CMD may include information about a logical address LA_READ.

In operation S626, the controller 130 may determine whether a write cache tag includes the same value with WRTIE CACHE TAG including the logical address LA_READ for the received read command READ_CMD. The controller 130 may determine whether data subject to the logical address LA_READ input with the read command READ_CMD is stored in a write buffer based on coincidence between the logical address LA_READ and the logical address included in the write cache tag. For example, the controller 130 may determine whether a first logical address included in the updated write cache tag is same with a second logical address included in the read command READ_CMD input from the host 102.

In operation S628, when the write cache tag does not include any information matched with the logical address LA_READ input with the read command READ_CMD ('N' in S626), the controller 130 can search for a physical address in map data. The map data associating a logical address with a physical address may include Logical to Physical (L2P) information or Physical to Logical (P2L) information. The controller 130 may search for a physical address corresponding to the logical address LA_READ input with the read command READ_CMD in the map data and obtain data from a memory block corresponding to the physical address.

In operation S630, when the write cache tag includes information matched with the logical address LA_READ input with the read command READ_CMD ('Y' in S626), the controller 130 may read the target data stored in a specific location of the write buffer based on an index, included in the write cache tag, corresponding to the logical address LA_READ input with the read command READ_CMD.

According to an embodiment, the controller 130 may not perform an error handling operation when a bad block occurs due to a program fail in a situation where a free block does not exist in the memory device 150. The controller 130 stores the target data, subjected to the program fail, in a write buffer, and updates the write cache tag indicating the information in which the target data is stored in the write buffer and associating the logical address and physical address of the target data with each other. The controller 130 may output read data to the host 102 more quickly and accurately when performing a read operation based on the write cache tag in response to a read command.

FIGS. 8A to 8D illustrate various embodiments for updating the write cache tag.

FIG. 8A shows an example of a write cache tag 802 after data is stored in a second region of the write buffer. Referring to FIG. 8A, the write cache tag 802 may include a plurality of indices and information INFO_LA which is capable of including a logical address corresponding to each of the indices. The plurality of indices may correspond to each of a plurality of regions allocated for storing data in the write buffer. For example, when the write buffer is divided into 10 regions, a first to a tenth indexes INDEX 1 to INDEX 10 included in the write cache tag 802 may correspond to the first to tenth regions individually.

The controller 130 may update the write cache tag 802 when data is stored in a specific region of the write buffer. For example, the controller 130 may update the write cache tag 802 by recording a logical address associated with the data as the information INFO_LA corresponding to an index indicating a specific region in the write buffer storing the data. For example, when data associated with a second logical address LA2 is stored in a second region of the write buffer, the controller 130 writes the second logical address LA2 in the information INFO_LA corresponding to a second index INDEX 2, as shown in FIG. 8A. The second logical address LA2 is added in the information INFO_LA so that write cache tag 802 may be updated.

FIG. 8B shows an example of a write cache tag 804 after (e.g., immediately after) performing a program operation regarding data stored in a second region of the write buffer.

The controller 130 may invalidate the information INFO_LA of the write cache tag 802 when a program operation regarding the data stored in the write buffer is performed in the memory device 150. For example, the controller 130 corresponds to the second index INDEX 2 of the write cache tag 804 at the time when the controller 130 controls the memory device 150 to perform a program operation with the data stored in the second region of the write buffer, as shown in FIG. 8B. For example, values or information in the logical address INFO_LA can be set to a value of NULL. A process of invalidating the information INFO_LA may be performed regardless of a program mode.

FIG. 8C shows an example of updated write cache tag 806 when a program operation according to a first mode has failed in the read only mode.

When a first program operation with a first mode is performed, the controller 130 may maintain data subject to the first program operation in a write buffer until the first program operation is successfully completed. For example, after the controller 130 invalidates the information INFO_LA corresponding to the second index INDEX 2 of the write cache tag 802, the data stored in the second region of the write buffer may be maintained until the program operation with the data stored in the second region of the write buffer is completely done, e.g., the data is successfully programmed in the memory device 150. When the first program operation with the data stored in the second region of the write buffer has failed and the memory system 110 enters the read-only mode, the controller 130 (as shown in FIG. 8C) updates the write cache tag 806 by writing the second logical address LA2 associated with the data in the information INFO_LA corresponding to the second index INDEX 2.

FIG. 8D shows an example of updated write cache tag 808 when a program operation according to the second mode has failed and the memory system 110 operates in the read only mode.

When performing a second program operation with the second mode, the controller 130 may release or delete the data, subject to the second program operation, in the write buffer at the time of performing the second program operation in the memory device 150. For example, as shown in FIG. 8B, the controller 130 invalidates the information INFO_LA corresponding to the second index INDEX 2 of the write cache tag 804, and the data stored in the second area may be deleted.

When the second program operation with the data stored in the second region of the write buffer has failed so that the memory system enters the read-only mode, the controller 130 may load the data subject to the second program operation from the page buffer in the memory device 150. For example, the controller 130 may load the data from the page buffer and store the data in a ninth region of the write buffer. As shown in FIG. 8D, the controller 130 writes the logical address LA2 associated with the data in the information INFO_LA corresponding to the ninth index INDEX 9 of the write cache tag to update the write cache tag 808.

In accordance with one or more embodiments, a memory system may skip an error-handling operation when program failure occurs in a read only mode and maintain original data in a write buffer. When a read command is input with a logical address indicating data associated with the program failure, the memory system may provide the original data stored in the write buffer to a host so that the latest data can be provided to the host.

The controllers, processors, and other signal-processing and signal-generating features of the embodiments disclosed herein may be implemented in logic which, for example, may include hardware, software, or both. When implemented at least partially in hardware, the controllers, processors, and other signal-processing and signal-generating features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, and other signal-processing and signal-generating features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

While the disclosure illustrates and describes specific embodiments, it will be apparent to those skilled in the art in light of the present disclosure that various changes and modifications may be made without departing from the spirit and scope of the invention as defined in the following claims.

What is claimed is:

1. A memory system, comprising:
a memory device including a memory block configured to store target data; and
a controller configured to maintain the target data in a write buffer until a program operation to the memory block succeeds, update a write cache tag associated with the target data when the program operation fails and a read only mode is entered, and read the target data from the write buffer based on the write cache tag when a read command regarding the target data is received.

2. The memory system according to claim 1, wherein the write cache tag includes a physical address of the target data stored in the write buffer, a logical address regarding the target data, and information indicating a validity of the logical address.

3. The memory system according to claim 2, wherein the controller is configured to read the target data from the write buffer when a first logical address included in the write cache tag is valid and is same as a second logical address input along with the read command.

4. The memory system according to claim 1, wherein the controller is configured to set a logical address regarding the target data in the write cache tag as invalid while the program operation is performed.

5. The memory system according to claim 4, wherein the controller is configured to update the write cache tag by validating the logical address regarding the target data in the write cache tag.

6. The memory system according to claim 1, wherein the controller is configured to establish that the memory block is a bad memory block when the program operation to the memory block fails.

7. The memory system according to claim 6, wherein the controller is configured to enter the read only mode when a count of memory blocks established as the bad memory block is equal to or greater than a threshold.

8. The memory system according to claim 1, wherein the controller is configured to store the target data in the write buffer when the target data is provided from an external device and to control the memory device to perform the program operation regarding the target data.

9. The memory system according to claim 8, wherein the controller is configured to maintain the target data stored in the write buffer when entering the read only mode.

10. The memory system according to claim 1, wherein the controller is configured to skip an error handling operation associated with the program operation when the program operation fails and when entering the read only mode, and
wherein the error handling operation includes allocating a free block for a new open memory block and re-programming the target data to the new open memory block.

11. A memory system, comprising:
a memory device including a memory block and a page buffer; and
a controller configured to move target data, stored in a write buffer, to the page buffer when performing a program operation to the memory block, load the target data stored in the page buffer to the write buffer when entering a read only mode after the program operation fails, and update a write cache tag regarding the target data loaded in the write buffer, wherein the controller is configured to obtain the target data from the write buffer based on the write cache tag when a read request is received for the target data.

12. The memory system according to claim 11, wherein the write cache tag includes a physical address of the target data stored in the write buffer, a logical address regarding the target data, and information indicative of a validity of the logical address.

13. The memory system according to claim 12, wherein the controller is configured to read the target data from the write buffer when a first logical address included in the write cache tag is valid and is same as a second logical address inputted along with the read command.

14. The memory system according to claim 11, wherein the controller is configured to set a logical address regarding the target data in the write cache tag as invalid while the program operation is performed.

15. The memory system according to claim 14, wherein the controller is configured to change a physical address of the memory device regarding the target data with a location of the target data loaded in the write buffer to update the write cache tag, and wherein the controller is configured to update the write cache tag by validating the logical address regarding the target data in the write cache tag.

16. The memory system according to claim 11, wherein the controller is configured to establish that the memory block is a bad memory block when the program operation to the memory block fails.

17. The memory system according to claim 16, wherein the controller is configured to enter the read only mode when a count of memory blocks established as the bad memory block is equal to or greater than a threshold.

18. The memory system according to claim 11, wherein the controller is configured to store the target data in the write buffer when the target data is provided from an external device and to control the memory device to perform the program operation regarding the target data.

19. The memory system according to claim 11, wherein the controller is configured to skip an error handling operation associated with the program operation when the program operation fails and when entering the read only mode, and wherein the error handling operation includes allocating a free block for a new open memory block and reprogramming the target data to the new open memory block.

20. A system, comprising:
an input coupled to receive a command; and
a controller configured to determine a memory block as a bad block and to update a write cache tag associated with target data in a write buffer when a first condition and a second condition are satisfied and read the target data from the write buffer based on the write cache tag in response to a read command regarding the target data, wherein:
the first condition includes a determination that the memory block is a bad block based on failure of a program operation performed for the memory block, the program operation performed based on the command received through the input, and
the second condition includes operation in a read only mode, and wherein the target data includes data corresponding to the program operation.

* * * * *